(12) United States Patent
Nago et al.

(10) Patent No.: US 9,331,234 B2
(45) Date of Patent: May 3, 2016

(54) SEMICONDUCTOR LIGHT EMITTING DEVICE AND METHOD FOR MANUFACTURING SEMICONDUCTOR LIGHT EMITTING DEVICE

(71) Applicant: KABUSHIKI KAISHA TOSHIBA, Minato-ku (JP)

(72) Inventors: Hajime Nago, Kanagawa-ken (JP); Yoshiyuki Harada, Ishikawa (JP); Shigeya Kimura, Kanagawa-ken (JP); Hisashi Yoshida, Tokyo (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/798,044

(22) Filed: Jul. 13, 2015

(65) Prior Publication Data

US 2015/0318435 A1 Nov. 5, 2015

Related U.S. Application Data

(62) Division of application No. 14/093,925, filed on Dec. 2, 2013, now Pat. No. 9,112,111.

(30) Foreign Application Priority Data

Dec. 27, 2012 (JP) ................................. 2012-286131

(51) Int. Cl.
*H01S 5/00* (2006.01)
*H01L 33/00* (2010.01)
(Continued)

(52) U.S. Cl.
CPC .......... *H01L 33/0075* (2013.01); *H01L 33/007* (2013.01); *H01L 33/0025* (2013.01); *H01L 33/06* (2013.01); *H01L 33/325* (2013.01);
(Continued)

(58) Field of Classification Search
CPC ... H01S 5/3216; H01S 5/3206; H01S 5/3063; H01S 5/305; H01S 5/3013
USPC .............................. 372/45.012, 45.01, 43.01
See application file for complete search history.

(56) References Cited

U.S. PATENT DOCUMENTS

2006/0220044 A1* 10/2006 Sugawara ......... H01L 21/02389
257/96
2007/0290230 A1 12/2007 Kawaguchi et al.
(Continued)

FOREIGN PATENT DOCUMENTS

JP 2009-152448 7/2009

*Primary Examiner* — Kinam Park
(74) *Attorney, Agent, or Firm* — Oblon, McClelland, Maier & Neustadt, L.L.P

(57) ABSTRACT

According to one embodiment, a semiconductor light emitting device includes an n-type semiconductor layer, a p-type semiconductor layer, and a light emitting layer. The p-type semiconductor layer includes a first p-side layer, a second p-side layer, and a third p-side layer. A concentration profile of Mg of a p-side region includes a first portion, a second portion, a third portion, a fourth portion, a fifth portion, a sixth portion and a seventh portion. The p-side region includes the light emitting layer, the second p-side layer, and the third p-side layer. A Mg concentration of the sixth portion is not less than $1 \times 10^{20}$ cm$^{-3}$ and not more than $3 \times 10^{20}$ cm$^{-3}$. The Al concentration is $1/100$ of the maximum value at a second position. A Mg concentration at the second position is not less than $2 \times 10^{18}$ cm$^{-3}$.

16 Claims, 11 Drawing Sheets

(51) Int. Cl.
  *H01L 33/32* (2010.01)
  *H01S 5/32* (2006.01)
  *H01S 5/30* (2006.01)
  *H01S 5/343* (2006.01)
  *H01L 33/06* (2010.01)
  *H01L 33/02* (2010.01)

(52) U.S. Cl.
  CPC ............... *H01S5/305* (2013.01); *H01S 5/3013* (2013.01); *H01S 5/3063* (2013.01); *H01S 5/3206* (2013.01); *H01S 5/3216* (2013.01); *H01S 5/34333* (2013.01); *H01L 33/02* (2013.01)

(56) References Cited

U.S. PATENT DOCUMENTS

| | | | |
|---|---|---|---|
| 2008/0073660 A1 | 3/2008 | Ohno et al. | |
| 2008/0251804 A1* | 10/2008 | Ohno | B82Y 20/00 257/96 |
| 2012/0138889 A1 | 6/2012 | Tachibana et al. | |
| 2012/0189030 A1* | 7/2012 | Miyoshi | B82Y 20/00 372/45.012 |
| 2013/0287055 A1* | 10/2013 | Miyoshi | B82Y 20/00 372/45.012 |

* cited by examiner

SEMICONDUCTOR LIGHT EMITTING DEVICE AND METHOD FOR MANUFACTURING SEMICONDUCTOR LIGHT EMITTING DEVICE

CROSS-REFERENCE TO RELATED APPLICATIONS

This application is a divisional of U.S. application Ser. No. 14/093,925, filed Dec. 2, 2013, which claims the benefit of priority from Japanese Patent Application No. 2012-286131, filed on Dec. 27, 2012; the entire contents of each of which are incorporated herein by reference.

FIELD

Embodiments described herein relate generally to a semiconductor light emitting device and a method for manufacturing the same semiconductor light emitting device.

BACKGROUND

Semiconductor light emitting devices such as light emitting diodes, laser diodes, etc., that use a nitride semiconductor are being developed. There are cases where the drive voltage of the semiconductor light emitting device increases as the density of the current that is supplied increases.

DETAILED DESCRIPTION

Figure 1:
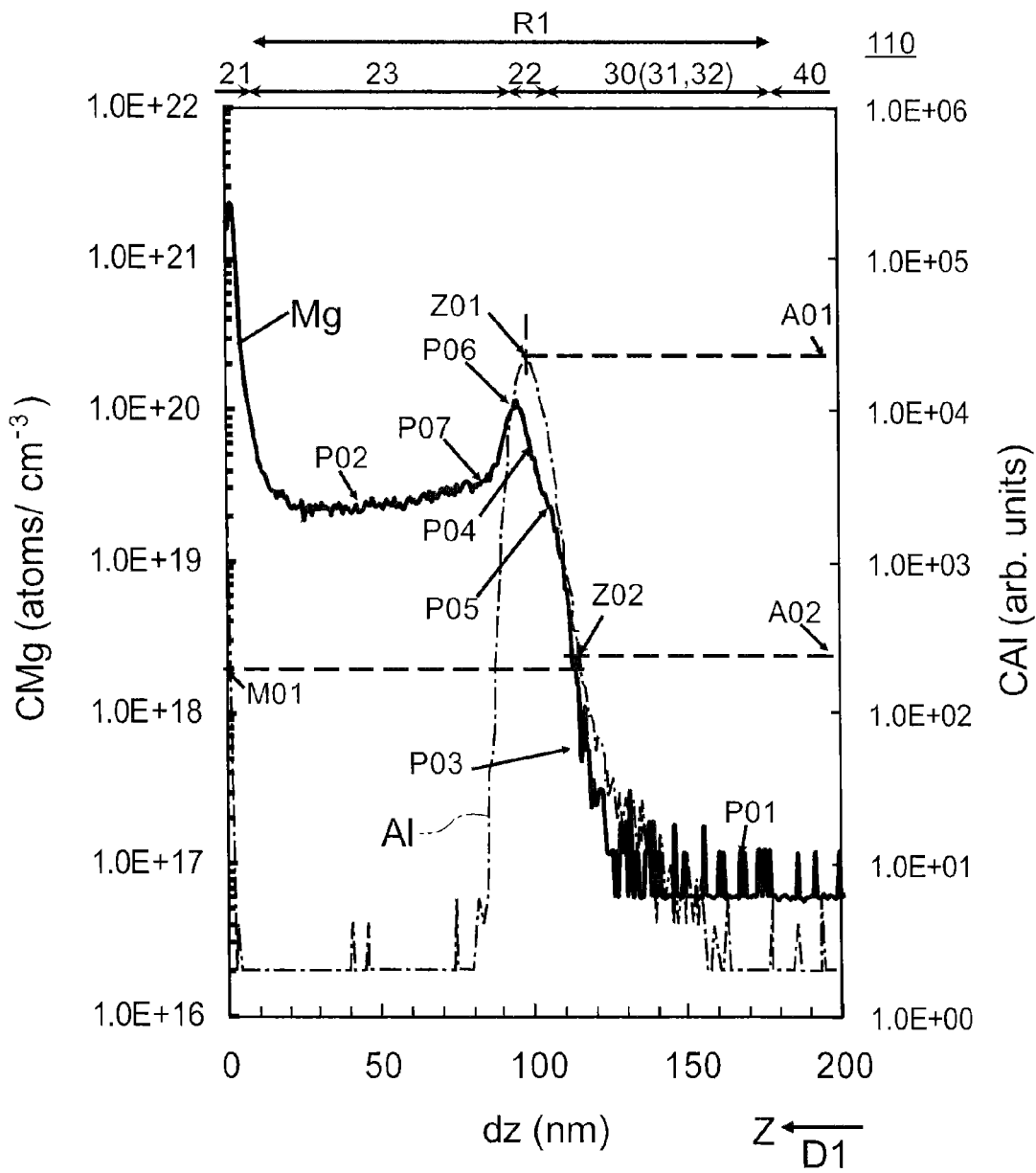
FIG. 1 is a graph showing the semiconductor light emitting device according to the first embodiment.

In general, according to one embodiment, a semiconductor light emitting device includes an n-type semiconductor layer, a p-type semiconductor layer, and a light emitting layer. The n-type semiconductor layer includes a nitride semiconductor. The p-type semiconductor layer includes a first p-side layer, a second p-side layer of $Al_{x2}Ga_{1-x2}N$ ($0.05 \leq x2 \leq 0.2$), and a third p-side layer of $Al_{x3}Ga_{1-x3}N$ ($0 \leq x3 \leq x2$). The first p-side layer includes a nitride semiconductor including Mg. The second p-side layer is provided between the first p-side layer and the n-type semiconductor layer and including Mg. The third p-side layer is provided between the first p-side layer and the second p-side layer and including Mg. The light emitting layer is provided between the n-type semiconductor layer and the second p-side layer. The light emitting layer includes a nitride semiconductor. A concentration profile of Mg of a p-side region includes a first portion, a second portion, a third portion, a fourth portion, a fifth portion, a sixth portion and a seventh portion. The p-side region includes the light emitting layer, the second p-side layer, and the third p-side layer. The second portion is provided between the first portion and the first p-side layer. The third portion is provided between the first portion and the second portion. A Mg concentration of the third portion increases at a first increase rate along a first direction from the n-type semiconductor layer toward the first p-side layer. The fourth portion is provided between the third portion and the second portion. The Mg concentration of the fourth portion increases at a second increase rate along the first direction. The fifth portion is provided between the third portion and the fourth portion. A Mg concentration of the fifth portion increases at a third increase rate along the first direction. The third increase rate is lower than the first increase rate and lower than the second increase rate. The sixth portion is provided between the fourth portion and the second portion. A Mg concentration of the sixth portion is not less than $1 \times 10^{20}$ cm$^{-3}$ and not more than $3 \times 10^{20}$ cm$^{-3}$ and is higher than the concentrations of Mg of the first portion, the second portion, the third portion, the fourth portion, and the fifth portion. The seventh portion is provided between the sixth portion and the second portion. A Mg concentration of the seventh portion decreases along the first direction. The Al concentration is $1/100$ of the maximum value at a second position arranged with the first position along the first direction in a region between the first position and a position corresponding to the first portion. A Mg concentration at the second position is not less than $2 \times 10^{18}$ cm$^{-3}$.

In general, according to one embodiment, a method for manufacturing a semiconductor light emitting device includes forming a light emitting layer including a nitride semiconductor on an n-type semiconductor layer including a nitride semiconductor, forming a first film of $Al_xGa_{1-x}N$ ($0.05 \leq x \leq 0.2$) on the light emitting layer, forming a second film including a nitride semiconductor including Mg on the first film, and forming a third film including a nitride semiconductor including Mg on the second film. The first film includes Mg. The forming of the first film includes alternately and multiply repeating a first process and a second process. The first process is supplying a group V source-material gas, a gas including Ga, a gas including Al, and a gas including Mg. The second process is supplying the group V source-material gas without supplying the gas including Ga, the gas including Al, and the gas including Mg. A maximum value of a concentration of Mg in a p-side region including the light emitting layer, the first film, and the second film is not less than $1 \times 10^{20}$ cm$^{-3}$ and not more than $3 \times 10^{20}$ cm$^{-3}$. An Al concentration in the p-side region has a maximum value at a first position. The Al concentration is $1/100$ of the maximum value at a second position arranged with the first position along a first direction from the light emitting layer toward the first film in a region between the first position and a position corresponding to the light emitting layer. A Mg concentration at the second position is not less than $2 \times 10^{18}$ cm$^{-3}$.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

The embodiment relates to a semiconductor light emitting device. The semiconductor light emitting device according to the embodiment includes, for example, a light emitting diode (LED), a laser diode (LD), etc.

FIG. 1 is a graph showing the semiconductor light emitting device according to the first embodiment.

Figure 2:
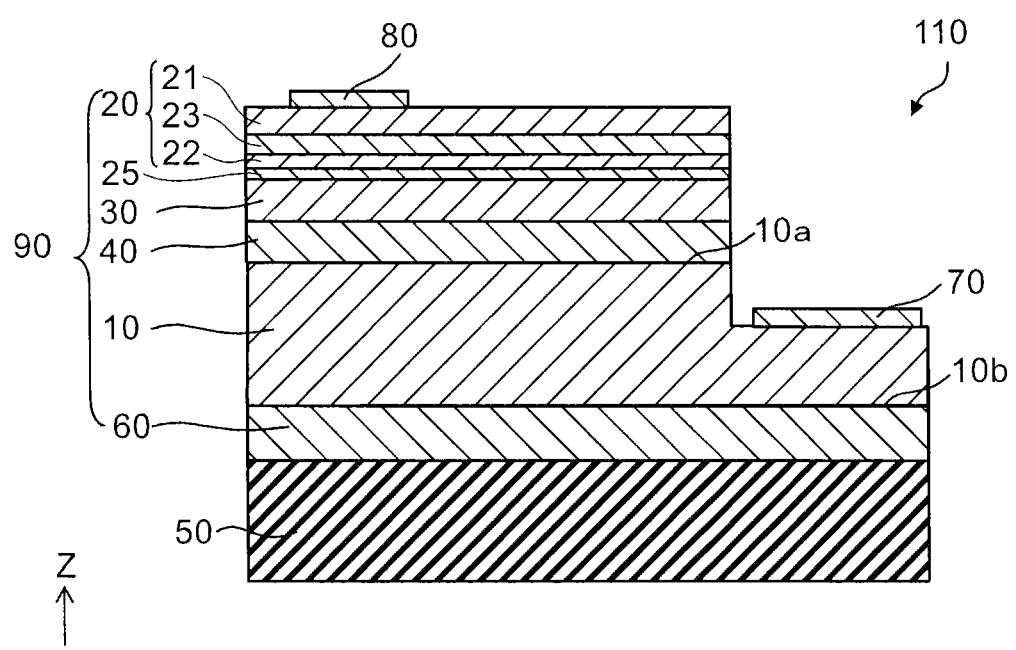
FIG. 2 is a schematic cross-sectional view showing the semiconductor light emitting device according to the first embodiment.

FIG. 2 is a schematic cross-sectional view showing the semiconductor light emitting device according to the first embodiment.

As shown in FIG. 2, the semiconductor light emitting device 110 according to the embodiment includes an n-type semiconductor layer 10, a p-type semiconductor layer 20, and a light emitting layer 30. These layers are included in a stacked structural body 90.

FIG. 1 shows a composition profile of the semiconductor light emitting device 110. The composition profile is described below.

The n-type semiconductor layer 10 includes a nitride semiconductor. The n-type semiconductor layer 10 has a first major surface 10a and a second major surface 10b. The first major surface 10a opposes the light emitting layer 30 (an intermediate layer 40). The second major surface 10b is on the side opposite to the first major surface 10a.

The n-type semiconductor layer 10 includes, for example, an n-type GaN layer doped with silicon (Si). The concentration of Si is, for example, about $8 \times 10^{18}$ (cm$^{-3}$, i.e., atoms/cm$^3$). The thickness of the n-type semiconductor layer 10 is, for example, not less than 2 micrometers (μm) and not more than 8 μm, e.g., 5 μm. At least a portion of the n-type semiconductor layer 10 functions as, for example, an n-type clad layer.

A direction from the n-type semiconductor layer 10 toward the p-type semiconductor layer 20 is taken as the stacking direction (a Z-axis direction). The first major surface 10a and the second major surface 10b of the n-type semiconductor layer 10 are substantially perpendicular to the Z-axis direction.

In the specification, being "stacked" includes not only the state of overlapping in contact with each other but also the state of overlapping with another layer inserted therebetween.

The p-type semiconductor layer 20 includes a first p-side layer 21, a second p-side layer 22, and a third p-side layer 23. The second p-side layer 22 is provided between the first p-side layer 21 and the n-type semiconductor layer 10. The third p-side layer 23 is disposed between the first p-side layer 21 and the second p-side layer 22.

The first p-side layer 21 includes a nitride semiconductor including Mg. The first p-side layer 21 includes, for example, a p-type GaN layer. The first p-side layer is, for example, a p-type contact layer. The Mg concentration of the first p-side layer 21 is higher than the Mg concentration of the third p-side layer 23. The Mg concentration of the first p-side layer 21 may be higher than the Mg concentration of the second p-side layer 22. The Mg concentration of the first p-side layer 21 is, for example, not less than $1 \times 10^{20}$ cm$^{-3}$ and not more than $3 \times 10^{21}$ cm$^{-3}$. The thickness of the first p-side layer 21 is, for example, not less than 5 nanometers (nm) and not more than 20 nm, e.g., about 10 nm.

The second p-side layer 22 includes Mg. For example, an $Al_{x2}Ga_{1-x2}N$ ($0.05 \leq x2 \leq 0.2$) layer is used as the second p-side layer 22. The second p-side layer 22 functions as, for example, an electron blocking layer to trap electrons in the light emitting layer 30. The thickness of the second p-side layer 22 is, for example, not less than 5 nm and not more than 20 nm, e.g., about 10 nm.

The third p-side layer 23 includes Mg. For example, an $Al_{x3}Ga_{1-x3}N$ ($0 \leq x3 < x2$) layer is used as the third p-side layer 23. For example, a p-type GaN layer is used as the third p-side layer 23. The Mg concentration of the third p-side layer 23 is not less than $1 \times 10^{19}$ cm$^{-3}$ and not more than $3 \times 10^{19}$ cm$^{-3}$. The Mg concentration is substantially constant inside the third p-side layer 23. The Mg concentration is described below. The third p-side layer 23 functions as, for example, a p-side clad layer. The thickness of the third p-side layer 23 is, for example, not less than 20 nm and not more than 150 nm, e.g., about 80 nm.

A capping layer 25 may be further provided between the light emitting layer 30 and the p-type semiconductor layer 20. For example, an undoped $Al_{x5}Ga_{1-x5}N$ ($0.003 \leq x5 \leq 0.03$) layer may be used as the capping layer 25. The Mg concentration of the capping layer 25 is lower than the Mg concentration of the p-type semiconductor layer 20 (e.g., the second p-side layer 22). The thickness of the capping layer 25 is, for example, not less than 1 nm and not more than 5 nm.

In the case where the capping layer 25 is formed, the capping layer 25 is observed in some cases and is not observed distinctly in some cases by, for example, electron micrograph observation, etc. For example, there are cases where Mg diffuses from the p-type semiconductor layer 20 into the capping layer 25; and the capping layer 25 is observed, for example, as a portion of the second p-side layer 22.

In the example, the semiconductor light emitting device 110 further includes the intermediate layer 40, a foundation layer 60, a substrate 50, a first electrode 70, and a second electrode 80. The intermediate layer 40 and the foundation layer 60 are included in the stacked structural body 90.

The foundation layer 60 is provided on the substrate 50. The n-type semiconductor layer 10 is provided on the foundation layer 60. The intermediate layer 40 is provided on the n-type semiconductor layer 10. The light emitting layer 30, the capping layer 25, and the p-type semiconductor layer 20 are provided in this order on the intermediate layer 40.

For example, a sapphire substrate (e.g., a c-plane sapphire substrate) is used as the substrate 50. The substrate 50 may be, for example, a substrate of GaN, SiC, ZnO, Si, etc. The plane orientation of the substrate 50 is arbitrary. The substrate 50 may be removed.

For example, an undoped GaN layer is used as the foundation layer 60. The thickness of the foundation layer 60 is, for example, not less than about 1 μm and not more than about 5 μm, e.g., about 3 μm. A buffer layer may be further provided between the substrate 50 and the foundation layer 60. The thickness of the buffer layer is, for example, not less than 5 nm and not more than 30 nm, e.g., about 20 nm.

The first electrode 70 is electrically connected to the n-type semiconductor layer 10. The second electrode 80 is electrically connected to the p-type semiconductor layer 20.

In the example, a portion of the n-type semiconductor layer 10 on the first major surface 10a side is exposed. The first electrode 70 is electrically connected to the n-type semiconductor layer 10 at the exposed portion of the n-type semiconductor layer 10. The first electrode 70 is disposed on, for example, the first major surface 10a side of the n-type semiconductor layer 10. The second electrode 80 is provided on, for example, the front surface of the p-type semiconductor layer 20.

In the specification of the application, the state of being "provided on" includes not only the state of being provided in direct contact but also the state in which another layer is inserted therebetween.

The first electrode 70 includes, for example, a stacked film of a Ti film/Pt film/Au film. The second electrode 80 includes, for example, a stacked film of a Ni film/Au film.

A voltage is applied between the first electrode 70 and the second electrode 80. A current is supplied to the light emitting layer 30 via the n-type semiconductor layer 10 and the p-type semiconductor layer 20. Light is emitted from the light emitting layer 30. The peak wavelength of the light (the emitted light) emitted from the light emitting layer 30 is, for example, not less than 400 nm and not more than 650 nm. The peak wavelength of the light (the emitted light) emitted from the light emitting layer 30 is, for example, not less than 430 nm and not more than 460 nm.

Figure 3:
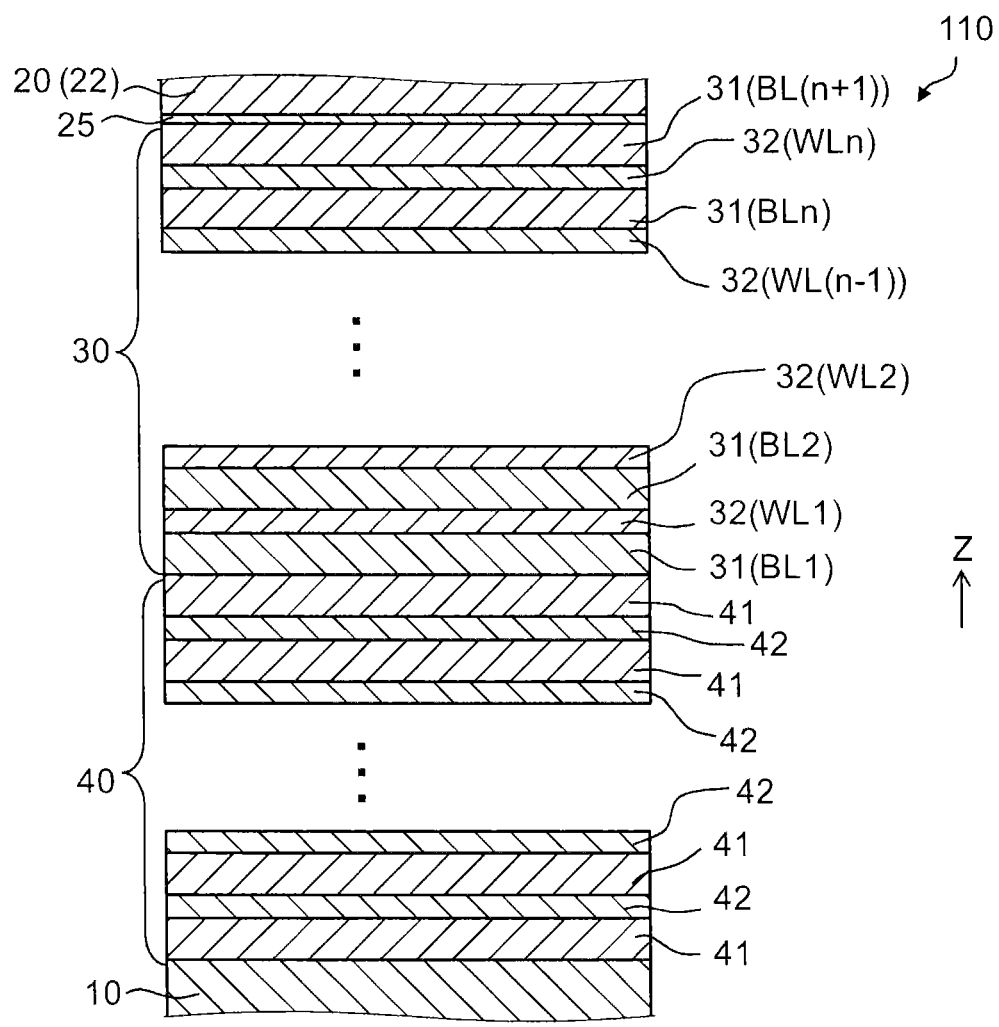
FIG. 3 is a schematic cross-sectional view showing a portion of the semiconductor light emitting device according to the first embodiment.

FIG. 3 is a schematic cross-sectional view showing a portion of the semiconductor light emitting device according to the first embodiment. FIG. 3 shows an example of the configuration of the light emitting layer 30 and the intermediate layer 40.

The light emitting layer 30 has, for example, a multiple quantum well (MQW) configuration. In such a case, the light emitting layer 30 includes three or more barrier layers 31, and well layers 32 provided respectively in the spaces between the barrier layers 31. For example, the multiple barrier layers 31 and the multiple well layers 32 are stacked alternately along the Z axis. Or, the light emitting layer 30 may have, for example, a single quantum well (SQW) configuration. In such a case, the light emitting layer 30 includes two barrier layers 31, and a well layer 32 provided between the barrier layers 31.

The light emitting layer 30 includes, for example, n+1 barrier layers 31 and n well layers 32 (n being an integer not less than 2). The (n+1)th barrier layer BLn(n+1) is disposed between the nth barrier layer BLn and the p-type semiconductor layer 20 (the second p-side layer 22). The nth well layer WLn is disposed between the (n−1)th well layer WL(n−1) and the p-type semiconductor layer 20 (the second p-side layer 22). The first barrier layer BL1 is provided between the n-type semiconductor layer 10 and the first well layer WL1. The nth well layer WLn is provided between the nth barrier layer BLn and the (n+1)th barrier layer BL(n+1). The (n+1)th barrier layer BL(n+1) is provided between the nth well layer WLn and the p-type semiconductor layer 20 (the second p-side layer 22).

In the example, the barrier layer 31 contacts the p-type semiconductor layer 20 (the second p-side layer 22). The well layer 32 may contact the p-type semiconductor layer 20 (the second p-side layer 22).

The barrier layer 31 includes $In_{y1}Ga_{1-y1}N$ (0≤y1<1). The well layer 32 includes $In_{y2}Ga_{1-y2}N$ (0<y2≤1 and y1<y2). In other words, the well layer 32 includes In. In the case where the barrier layer 31 includes In, the In concentration of the barrier layer 31 is lower than the In concentration of the well layer 32. Or, the barrier layer 31 substantially does not include In. The bandgap energy of the barrier layer 31 is greater than the bandgap energy of the well layer 32. The In composition ratio y2 of the well layer 32 is, for example, not less than 0.1 and not more than 0.15, e.g., 0.14.

The intermediate layer 40 includes multiple first layers 41 and multiple second layers 42. The multiple first layers 41 and the multiple second layers 42 are stacked alternately in the Z-axis direction.

The first layer 41 includes, for example, an n-type GaN layer doped with Si. The Si concentration of the first layer 41 is, for example, about $2\times10^{18}$ cm$^{-3}$. The second layer 42 includes, for example, an undoped InGaN layer. The second layer 42 includes, for example, an undoped $In_{y3}Ga_{1-y3}N$ (0<y3<0.1) layer. The thickness of the first layer 41 is, for example, not less than 2 nm and not more than 6 nm, e.g., about 3 nm. The thickness of the second layer 42 is, for example, not less than 0.5 nm and not more than 2 nm, e.g., about 1 nm. The intermediate layer 40 has a superlattice structure. In the example, the number of the second layers 42 is, for example, not less than 20 layers, e.g., 30 layers.

FIG. 1 shows the profile of the Mg concentration and the profile of the Al concentration of the semiconductor light emitting device 110. FIG. 1 shows results of secondary ion mass spectrometry (SIMS) of the semiconductor light emitting device 110.

In FIG. 1, the horizontal axis is a position dz in the depth direction (the Z-axis direction). The position where the position dz is 0 nm is the upper surface of the first p-side layer 21 (the surface on the side opposite to the light emitting layer 30). The vertical axis on the left side is the concentration of Mg (CMg having units of /cm$^{-3}$). The vertical axis on the right side is the Al concentration (CAl having arbitrary units).

As shown in FIG. 1, the semiconductor light emitting device 110 includes a p-side region R1. The p-side region R1 includes the light emitting layer 30, the second p-side layer 22, and the third p-side layer 23. The concentration profile of Mg in the p-side region R1 includes first to seventh portions P01 to P07. The second portion P02 is provided between the first portion P01 and the first p-side layer 21. The third portion P03 is provided between the first portion P01 and the second portion P02. The fourth portion P04 is provided between the third portion P03 and the second portion P02. The fifth portion P05 is provided between the third portion P03 and the fourth portion P04. The sixth portion P06 is provided between the fourth portion P04 and the second portion P02. The seventh portion P07 is provided between the sixth portion P06 and the second portion P02.

The Mg concentration of the first portion P01 is low and is, for example, not less than $1\times10^{16}$ cm$^{-3}$ and not more than $5\times10^{17}$ cm$^{-3}$. At least a portion of the first portion P01 corresponds to, for example, the light emitting layer 30.

The Mg concentration of the second portion P02 is, for example, not less than $1\times10^{19}$ cm$^{-3}$ and not more than $5\times10^{19}$ cm$^{-3}$ and is higher than the Mg concentration of the first portion P01. At least a portion of the second portion P02 corresponds to the third p-side layer 23.

The Mg concentration of the first p-side layer 21 is, for example, not less than $3\times10^{20}$ cm$^{-3}$ and not more than $3\times10^{21}$ cm$^{-3}$. The Mg concentration of the first p-side layer 21 is higher than the Mg concentration of the second portion P02.

The sixth portion P06 has the highest Mg concentration in the p-side region R1 that includes the light emitting layer 30, the second p-side layer 22, and the third p-side layer 23. In the p-side region R1, the portion where the Mg concentration has a peak corresponds to the sixth portion P06. The sixth portion P06 corresponds to at least a portion of the second p-side layer 22.

The direction from the n-type semiconductor layer 10 toward the first p-side layer 21 is taken as a first direction D1.

The first direction D1 is a direction along the Z-axis direction. The first direction D1 corresponds to the upward direction in FIG. 2.

The Mg concentration of the third portion P03 increases along the first direction D1. The Mg concentration of the third portion P03 increases at a first increase rate.

The Mg concentration of the fourth portion P04 increases along the first direction D1. The Mg concentration of the fourth portion P04 increases at a second increase rate.

The Mg concentration of the fifth portion P05 increases along the first direction D1. The Mg concentration of the fifth portion P05 increases at a third increase rate. The third increase rate is lower than the first increase rate. The third increase rate is lower than the second increase rate.

The Mg concentration of the sixth portion P06 is higher than the concentrations of Mg of the first portion P01, the second portion P02, the third portion P03, the fourth portion P04, and the fifth portion P05. The Mg concentration of the sixth portion P06 is not less than $1 \times 10^{20}$ cm$^{-3}$ and not more than $3 \times 10^{20}$ cm$^{-3}$.

The Mg concentration of the seventh portion P07 decreases along the first direction D1.

The Mg concentration of the third portion P03 increases along the first direction D1 (at the first increase rate). Then, the increase rate of the fifth portion P05 is lower (the third increase rate). Further, the increase rate of the Mg concentration of the fourth portion P04 becomes high again (the second increase rate). Then, the Mg concentration of the sixth portion P06 is the highest Mg concentration. Subsequently, the Mg concentration of the seventh portion P07 is lower.

On the other hand, as shown in FIG. 1, the Al concentration increases abruptly along the first direction D1 at the vicinity of the interface between the light emitting layer 30 and the second p-side layer 22. For example, the Al concentration of the light emitting layer 30 is not less than 1 and not more than 20 (no units). For example, the Al concentration of the first p-side layer 21 is not less than 1 and not more than 10. In at least a portion of the third p-side layer 23 as well, the Al concentration is not less than 1 and not more than 10. The Al concentration has a maximum value at the vicinity of the second p-side layer 22. In the example, the maximum value of the Al concentration is about $2 \times 10^4$.

A first position Z01 and a second position Z02 are set in the p-side region R1 to describe the profile of the Al concentration.

The first position Z01 is a position along the first direction D1. The second position Z02 also is a position along the first direction D1. The second position Z02 is provided in a region between the first position Z01 and a position (a position along the first direction D1) corresponding to the first portion P01. The second position Z02 is arranged with the first position Z01 along the first direction D1. In the example, the first position Z01 is disposed inside the second p-side layer 22.

The Al concentration at the first position Z01 is taken as a first Al value A01. The first Al value A01 is the maximum value of the Al concentration in the p-side region R1.

The Al concentration at the second position Z02 is taken as a second Al value A02. The second Al value A02 is 1/100 of the first Al value A01 which is the maximum value.

The Al concentration decreases abruptly along the first direction D1 between the first position Z01 and the position of the first p-side layer 21.

In the example, the light emitting layer 30 substantially does not include Al. The third p-side layer 23 substantially does not include Al. The second p-side layer 22 includes Al.

The Mg concentration at the second position Z02 is taken as a first Mg value M01.

In the embodiment, the first Mg value M01 is, for example, not less than $2 \times 10^{18}$ cm$^{-3}$. It is favorable for the first Mg value M01 to be, for example, not more than $1.2 \times 10^{19}$ cm$^{-3}$. In the example shown in FIG. 1, the first Mg value M01 is $2.1 \times 10^{18}$ cm$^{-3}$.

In the semiconductor light emitting device 110 as shown in FIG. 1, the Mg concentration increases to follow the increase of the Al concentration. The first Mg value M01 at the second position Z02 is not less than $2 \times 10^{18}$ cm$^{-3}$. Thereby, the drive voltage can be lower. The drive voltage is described below.

As described above, even in the case where the capping layer 25 is formed, there are cases where the capping layer 25 is not observed distinctly. Therefore, the capping layer 25 is not shown in FIG. 1.

An example of a method for manufacturing the semiconductor light emitting device 110 will now be described. The profiles of the Mg concentration and the Al concentration shown in FIG. 1 are obtained by, for example, the manufacturing method described below.

For example, organic cleaning and acid cleaning of the substrate 50 are performed. After the cleaning, crystal growth is performed on the substrate 50 to form, in order, a buffer layer, the foundation layer 60, the n-type semiconductor layer 10, the intermediate layer 40, the light emitting layer 30, and the p-type semiconductor layer 20. Thereby, the stacked structural body 90 is formed on the substrate 50. The buffer layer is formed if necessary.

For example, MOCVD (Metal Organic Chemical Vapor Deposition) is used to form the stacked structural body 90. Hydride vapor phase epitaxy (HVPE), molecular beam epitaxy (MBE), etc., may be used to form these layers. An example in which the stacked structural body 90 is formed by MOCVD will now be described.

After cleaning, the substrate 50 is placed inside the reaction chamber of a MOCVD apparatus. The substrate 50 includes c-plane sapphire. The temperature of the substrate 50 is increased to 1160° C. by high-frequency heating in an atmospheric pressure mixed gas atmosphere of nitrogen ($N_2$) gas and hydrogen ($H_2$) gas. Thereby, gas phase etching of the front surface of the substrate 50 is performed. The native oxide film that was formed on the front surface of the substrate 50 is removed.

The temperature of the substrate 50 is reduced to 530° C. A buffer layer (a low-temperature buffer layer) is formed on the substrate 50. A carrier gas and a process gas are supplied to form the buffer layer. For example, a gas mixture of $N_2$ gas and $H_2$ gas is used as the carrier gas. In the example, a group V source-material gas, a gas including Ga, and a gas including Al are supplied as the process gas. For example, an ammonia ($NH_3$) gas is used as the group V source-material gas. For example, tri-methyl gallium (TMG) is used as the gas including Ga. For example, tri-ethyl gallium (TEG) may be used as the gas including Ga. For example, tri-methyl aluminum (TMA) is used as the gas including Al.

For example, an undoped GaN layer is formed as the foundation layer 60. The supply of TMG and TMA is stopped while continuing the supply of $NH_3$. The temperature is increased to 1150° C. TMG is supplied again while maintaining the temperature at 1150° C. Thereby, the foundation layer 60 is formed. The thickness of the foundation layer 60 is, for example, about 3 μm.

For example, an n-type GaN layer is formed as the n-type semiconductor layer 10. Further, a gas including Si is supplied without changing the process gas. For example, silane ($SiH_4$) gas is used as the gas including Si. The temperature of the substrate 50 is 1150° C. The Si concentration of the n-type semiconductor layer 10 is, for example, $8×10^{18}/cm^{-3}$. The thickness of the n-type semiconductor layer 10 is, for example, about 5 µm.

The supply of TMG and $SiH_4$ gas is stopped while continuing the supply of $NH_3$. The temperature of the substrate 50 is reduced to 800° C. and maintained at 800° C.

For example, an n-type GaN layer is formed as the first layer 41 of the intermediate layer 40. The temperature of the substrate 50 is 800° C. in the formation of the first layer 41. $N_2$ gas is used as the carrier gas. $NH_3$, TMG, and $SiH_4$ gas are used as the process gas. The Si concentration of the first layer 41 is, for example, about $2×10^{18}/cm^{-3}$. The thickness of the first layer 41 is, for example, about 3 nm.

For example, undoped $In_{y3}Ga_{1-y3}N$ (0<y3<0.1) is formed as the second layer 42 of the intermediate layer 40. In the formation of the second layer 42, the supply of $SiH_4$ gas is stopped; and a gas including In is supplied. For example, tri-methyl indium (TMI) is used as the gas including In. The temperature of the substrate 50 is 800° C. y3 of the undoped $In_{y3}Ga_{1-y3}N$ layer (the second layer 42) is, for example, 0.08. The thickness of the second layer 42 is, for example, 1 nm.

The formation of the first layer 41 recited above and the formation of the second layer 42 recited above are multiply repeated. In other words, the supply of $SiH_4$ gas and the supply of TMI are alternately repeated. The number of repetitions is, for example, thirty periods. Thereby, the intermediate layer 40 having a superlattice structure is formed.

The light emitting layer 30 is formed. First, for example, a GaN layer is formed as the barrier layer 31. $N_2$ gas is used as the carrier gas to form the barrier layer 31. $NH_3$ and TMG are used as the process gas. The temperature of the substrate 50 is 830° C. The thickness of the barrier layer 31 is, for example, about 5 nm.

For example, an $In_{y2}Ga_{1-y2}N$ layer (0<y2<1) is formed as the well layer 32. TMI also is supplied to form the well layer 32. The temperature of the substrate 50 is 830° C. y2 of the $In_{y2}Ga_{1-y2}N$ layer (the well layer 32) is, for example, 0.14. The thickness of the well layer 32 is, for example, about 3 nm.

For example, the formation of the barrier layer 31 recited above and the formation of the well layer 32 recited above are multiply repeated. In other words, TMI is supplied intermittently. The number of repetitions is, for example, eight periods.

The final barrier layer 31 (GaN layer) is formed on the final well layer 32. The thickness of the GaN layer (the final barrier layer 31) is, for example, 5 nm. Here, the barrier layer 31 is formed as the uppermost portion of the light emitting layer 30. The well layer 32 may be formed as the uppermost portion of the light emitting layer 30.

For example, an undoped AlGaN layer is formed as the capping layer 25 on the light emitting layer 30 in the example. In the formation of the capping layer 25, TMA is supplied; and the temperature of the substrate 50 is 830° C. The thickness of the AlGaN layer used to form the capping layer 25 is, for example, 5 nm directly after formation.

Then, the supply of TMG is stopped while continuing the supply of $NH_3$. The temperature of the substrate 50 is increased to 1030° C. in a $N_2$ gas atmosphere. The temperature is maintained at 1030° C.

A p-type AlGaN layer is formed as the second p-side layer 22 at the substrate temperature of 1030° C. A gas mixture of $N_2$ gas and $H_2$ gas are used as the carrier gas to form the second p-side layer 22. A gas including $NH_3$, TMG, TMA, and Mg is supplied as the process gas. For example, bis (cyclopentadienyl)magnesium ($Cp_2Mg$) is used as the gas including Mg.

The Mg concentration is $2×10^{19}$ $cm^{-3}$ in the initial formation of the second p-side layer 22. The Mg concentration increases inside the second p-side layer 22 to reach, for example, about $1×10^{20}$ $cm^{-3}$. The thickness of the second p-side layer 22 is about 10 nm.

An example of the method for forming the second p-side layer 22 will now be described.

The temperature of the substrate 50 is stabilized at 1030° C. which is the growth temperature. After the temperature has stabilized, TMG, TMA, and $Cp_2Mg$ are supplied in pulses while supplying the carrier gas and $NH_3$ of the process gas. The supply amount of TMG is, for example, 28 micromols/minute (µmol/min); the supply amount of TMA is, for example, 1.9 µmol/min; and the supply amount of $Cp_2Mg$ is, for example, 0.25 µmol/min. For example, the supply of TMG, TMA, and $Cp_2Mg$ being ON and OFF is repeated for 60 cycles. Thereby, the second p-side layer 22 is formed.

Continuing from the formation of the second p-side layer 22, a p-type GaN layer is formed as the third p-side layer 23. Namely, after the formation of the second p-side layer 22, the supply of TMA is stopped while continuing the supply of TMG and $Cp_2Mg$. The temperature of the substrate 50 is 1030° C. The Mg concentration of the third p-side layer 23 is about $2×10^{19}$ $cm^{-3}$. The thickness of the third p-side layer 23 is about 80 nm.

Continuing from the formation of the third p-side layer 23, a p-type GaN layer is formed as the first p-side layer 21. Namely, the supply amount of $Cp_2Mg$ is increased after the formation of the third p-side layer 23. In the formation of the first p-side layer 21, the temperature of the substrate 50 is 1030° C. The Mg concentration of the first p-side layer 21 is about $1×10^{21}$ $cm^{-3}$. The thickness of the first p-side layer 21 is about 10 nm.

Thus, the p-type semiconductor layer 20 is formed.

The supply of TMG and $Cp_2Mg$ is stopped while continuing the supply of $NH_3$. In other words, the entire supply of the process gas is stopped. The supply of the carrier gas is continued. The temperature of the substrate 50 is allowed to fall naturally. The supply of $NH_3$ is continued until the temperature of the substrate 50 reaches 300° C.

The substrate 50 is extracted from the reaction chamber of the MOCVD apparatus.

A portion of the stacked structural body 90 is removed from the p-type semiconductor layer 20 side until the n-type semiconductor layer 10 is reached. For example, RIE (Reactive Ion Etching) is used to remove the stacked structural body 90. The first electrode 70 is formed on the n-type semiconductor layer 10 that is exposed. The first electrode 70 is, for example, a Ti film/Pt film/Au film. The second electrode 80 is formed on the first p-side layer 21. The second electrode 80 is, for example, a Ni film/Au film.

Thereby, the semiconductor light emitting device 110 is formed. After forming the stacked structure film (the stacked structural body 90) on the substrate 50, the substrate 50 may be removed. A portion of the foundation layer 60 may be removed when removing the substrate 50.

The Mg concentration profile and the Al concentration profile shown in FIG. 1 are obtained in the semiconductor light emitting device 110 thus made.

The device size of the semiconductor light emitting device 110 may be a square having sides of 0.75 mm. For such a device size, the drive voltage for a current of 350 mA is 3.24 V.

Semiconductor light emitting devices of two reference examples will now be described.

Other than the formation process of the second p-side layer 22, the methods for manufacturing the two reference examples are the same as the method for manufacturing the semiconductor light emitting device 110. In the reference examples, the thickness of the second p-side layer 22 is the same as the semiconductor light emitting device 110. In the formation of the second p-side layer 22 of the reference examples, the temperature of the substrate 50, the type of the carrier gas, and the type of the process gas are the same as those of the method for manufacturing the semiconductor light emitting device 110. The formation conditions of the second p-side layer 22 will now be described.

In the formation of the second p-side layer 22 of the first reference example, $NH_3$, TMG, TMA, and $Cp_2Mg$ are supplied simultaneously. TMG, TMA, and $Cp_2Mg$ are supplied not in pulses but continuously. In the first reference example, the supply amount of TMG, the supply amount of TMA, and the supply amount of $Cp_2Mg$ are the same as those of the semiconductor light emitting device 110.

In other words, in the formation of the second p-side layer 22 for the semiconductor light emitting device 110, TMG, TMA, and $Cp_2Mg$ are supplied in pulses while supplying a constant amount of $NH_3$; but for the first reference example, $NH_3$, TMG, TMA, and $Cp_2Mg$ are supplied simultaneously and continuously.

Other than the supply amount of $Cp_2Mg$ being low, the formation of the second p-side layer 22 of the second reference example has the same formation conditions as the semiconductor light emitting device 110 and the first reference example. In other words, in the second reference example, TMG, TMA, and $Cp_2Mg$ are supplied in pulses while supplying a constant amount of $NH_3$. Also, the supply amount of $Cp_2Mg$ is 0.06 µmol/min and is less than that of the semiconductor light emitting device 110.

The size of the semiconductor light emitting device for the first reference example and the second reference example is the same as that of the semiconductor light emitting device 110. In the first reference example, the drive voltage for a current of 350 mA is 3.34 V. In the second reference example, the drive voltage for a current of 350 mA also is 3.34 V.

Thus, the drive voltage of the semiconductor light emitting device 110 according to the embodiment is 3.24 V; and the drive voltage can be lower than those of the reference examples. It is considered that this is due to the differences of the profile of the Mg concentration and the profile of the Al concentration between the embodiment and the reference examples.

Figure 4:
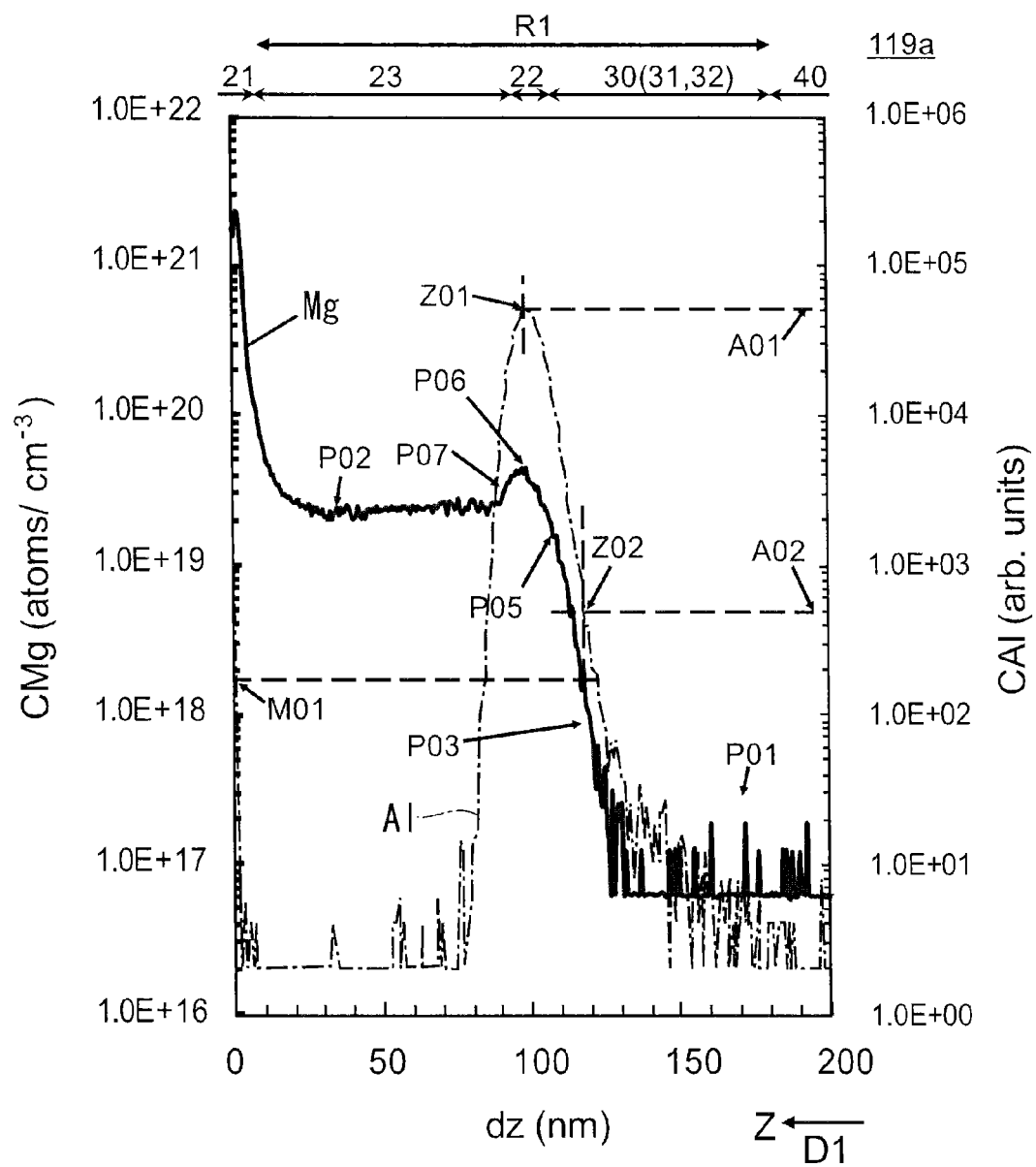
FIG. 4 is a graph showing the semiconductor light emitting devices of the reference examples.
Figure 5:
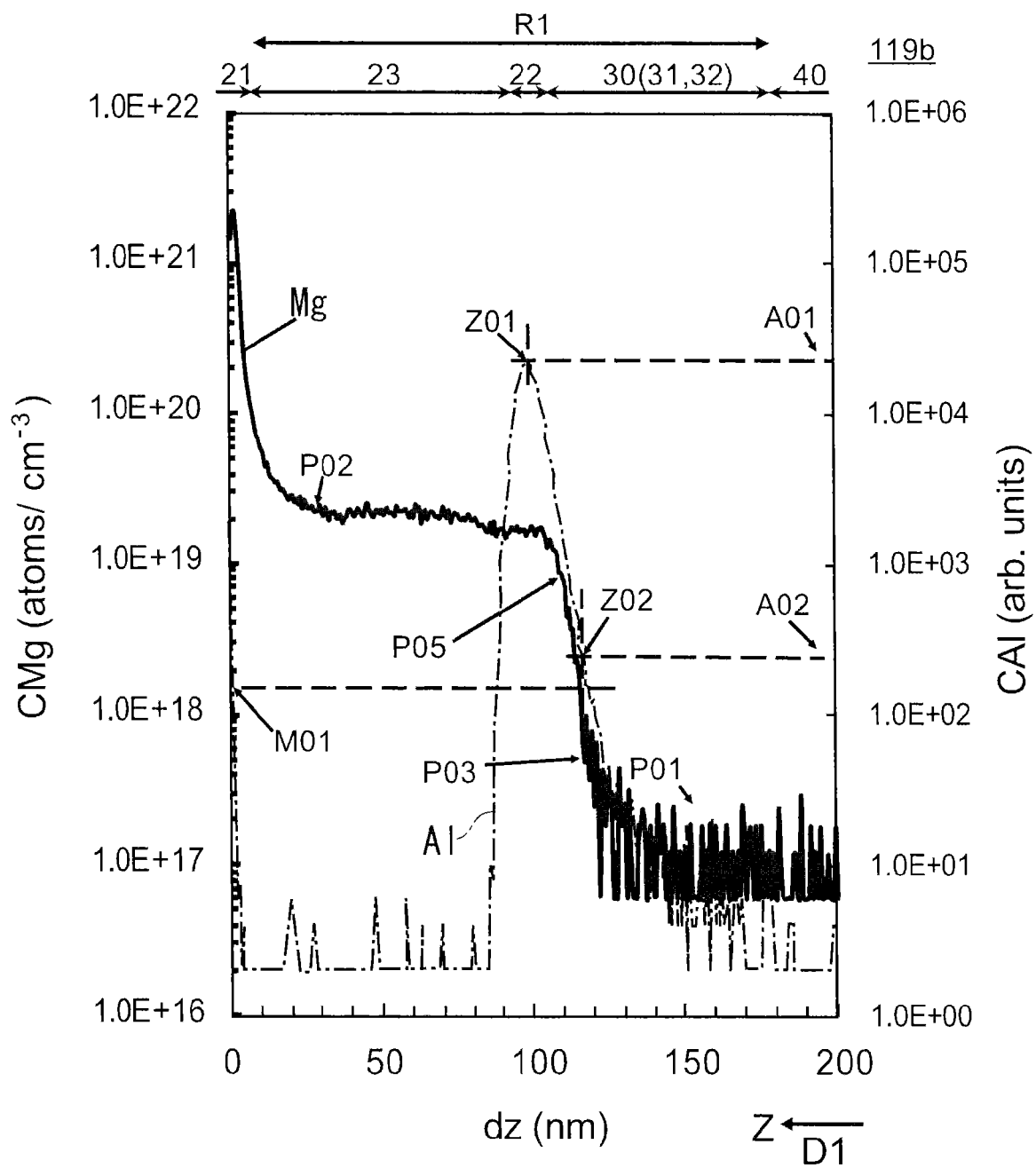
FIG. 5 is a graph showing the semiconductor light emitting devices of the reference examples.

FIG. 4 and FIG. 5 are graphs showing the semiconductor light emitting devices of the reference examples.

FIG. 4 corresponds to the semiconductor light emitting device 119a of the first reference example. FIG. 5 corresponds to the semiconductor light emitting device 119b of the second reference example. These drawings show SIMS analysis results. The horizontal axis is the position dz in the depth direction (the Z-axis direction). The vertical axis on the left side is the concentration of Mg (CMg having units of/$cm^{-3}$). The vertical axis on the right side is the Al concentration (CAl having arbitrary units).

In the semiconductor light emitting device 119a of the first reference example as shown in FIG. 4, the Mg concentration increases along the first direction D1 from the light emitting layer 30; and the Mg concentration is the highest at the sixth portion P06. The third portion P03, which has a high increase rate of the Mg concentration, and the fifth portion P05, which has an increase rate that is lower than that of the third portion P03, are observed between the first portion P01 and the sixth portion P06. However, the fourth portion P04 of the semiconductor light emitting device 119a, in which the increase rate again becomes high, is not observed.

The maximum value of the Mg concentration is $4.4 \times 10^{19}$ $cm^{-3}$. This corresponds to the maximum value of the Mg concentration of the second p-side layer 22 being $4.4 \times 10^{19}$ $cm^{-3}$. The Mg concentration of the second portion P02 is about $2.5 \times 10^{19}$ $cm^{-3}$. This corresponds to the Mg concentration of the third p-side layer 23 being about $2.5 \times 10^{19}$ $cm^{-3}$.

On the other hand, the Al concentration increases along the first direction D1 from the light emitting layer 30 to reach the first Al value A01 which is the maximum value at the first position Z01.

The Mg concentration also increases along the first direction D1. However, the increase of the Mg concentration CMg is slower than the increase of the Al concentration. For example, the Mg concentration (the first Mg value M01) at the second position Z02 is lower than that of the semiconductor light emitting device 110. The first Mg value M01 of the semiconductor light emitting device 119a is $1.8 \times 10^{18}$ $cm^{-3}$.

Thus, in the semiconductor light emitting device 119a, there is a delay in the Mg doping; and the Mg concentration reaches the Mg concentration (the maximum value) of $4.4 \times 10^{19}$ $cm^{-3}$ and continues toward $2.5 \times 10^{19}$ $cm^{-3}$ which is the Mg concentration of the third p-side layer 23 without the first Mg value M01 reaching the Mg concentration of $2 \times 10^{18}$ $cm^{-3}$.

Thus, in the semiconductor light emitting device 119a of the first reference example, the maximum value of the Mg concentration of the second p-side layer 22 is low, i.e., $4.4 \times 10^{19}$ $cm^{-3}$; the first Mg value M01 also is low; and the increase of the Mg concentration is slower than the increase of the Al concentration. Therefore, the Mg concentration of the second p-side layer 22 does not become sufficiently high. This is considered to be why the drive voltage of the semiconductor light emitting device 119a is higher than the drive voltage of the semiconductor light emitting device 110.

As shown in FIG. 5, in the semiconductor light emitting device 119b of the second reference example as well, the Mg concentration increases along the first direction D1 from the light emitting layer 30. However, a peak of the Mg concentration is not observed at the portion corresponding to the second p-side layer 22.

The maximum value of the Mg concentration is $2.0 \times 10^{19}$ $cm^{-3}$. The Mg concentration of the second portion P02 is about $2.5 \times 10^{19}$ $cm^{-3}$. The Mg concentration (the first Mg value M01) at the second position Z02 is $1.3 \times 10^{18}$ $cm^{-3}$.

In the semiconductor light emitting device 119b as well, the increase of the Mg concentration along the first direction D1 is relatively abrupt at the vicinity of the interface between the second p-side layer 22 and the light emitting layer 30. The Mg concentration rises abruptly to reach $2 \times 10^{19}$ $cm^{-3}$, which is the target concentration of the first stage, at the vicinity of the interface. However, the Mg concentration continues toward the concentration of the second p-side layer 22 without increasing any higher.

Thus, in the semiconductor light emitting device 119b of the second reference example, the maximum value of the Mg concentration of the second p-side layer 22 is low. This is considered to be why the Mg concentration of the second p-side layer 22 is insufficiently high and the drive voltage is high.

Conversely, in the semiconductor light emitting device 110 according to the embodiment as shown in FIG. 1, the Mg concentration increases to follow the increase of the Al concentration. The Mg concentration increases without being slower than the increase of the Al concentration. The first Mg value M01 at the second position Z02 is high, i.e., not less than $2 \times 10^{18}$ $cm^{-3}$. Thereby, the drive voltage can be lower.

In the semiconductor light emitting device 110 as shown in FIG. 1, the first-direction position of the sixth portion P06 where the Mg concentration is the highest is proximal to the first position Z01 in the first direction where the Al concentration is the highest. The Mg concentration increases without being slower than the increase of the Al concentration corresponding to the second p-side layer 22.

When growing the semiconductor layers, the memory effect of the Mg that is doped into the second p-side layer 22 is large. Adhesion of the Mg supply to the inner walls of the crystal growth reactor, etc., occur during the film formation; and it takes time for the source material element of the process gas to reach the front surface of the substrate 50. Therefore, the delay of the doping occurs more easily for Mg than for Al. In the case where the doping of Mg is delayed, a region having a low Mg concentration (an undoped region) is formed at the vicinity of the interface between the light emitting layer 30 and the second p-side layer 22. This region is a high-resistance region. In the case where the high-resistance region forms, the drive voltage of the semiconductor light emitting device is higher.

In the semiconductor light emitting device 110 as shown in FIG. 1, the Mg concentration inside the second p-side layer rises abruptly from the vicinity of the interface between the light emitting layer 30 and the second p-side layer 22 to the target concentration of the first stage (e.g., not less than $2 \times 10^{18}$ cm$^{-3}$). In other words, the second p-side layer 22 substantially does not include an undoped region (a high-resistance region). Further, the maximum value of the Mg concentration inside the second p-side layer 22 is high. The maximum value of the Mg concentration (the target value of the second stage) is not less than about $1 \times 10^{20}$ cm$^{-3}$.

In the embodiment, the formation of a region (a high-resistance region) having a low Mg concentration is suppressed by the Mg concentration increasing to follow the increase of the Al concentration without being slower than the increase of the Al concentration. Therefore, a semiconductor light emitting device having a low drive voltage can be provided.

In the case where the Al concentration of the second p-side layer 22 is high, it is difficult to the dope Mg at a high concentration.

In the embodiment, the peak wavelength of the light emitted from the light emitting layer 30 is not less than 400 nm and not more than 650 nm. In other words, the light emitted from the light emitting layer 30 is not ultraviolet light. Therefore, the bandgap energy of the well layer 32 is set to be small.

Therefore, the Al composition ratio x2 of $Al_{x2}Ga_{1-x2}N$ used as the second p-side layer 22 that functions as the electron blocking layer is set to be relatively low, that is, not less than 0.05 and not more than 0.2. Thus, in the embodiment, Mg can be introduced to the second p-side layer 22 at a high concentration because the Al composition ratio of the second p-side layer 22 is relatively low.

In the embodiment as shown in FIG. 1, the Mg concentration rises abruptly to follow the increase of the Al concentration without being slower than the increase of the Al concentration and reaches the target value of the first stage, e.g., not less than $2 \times 10^{18}$ cm$^{-3}$. The portion where the Mg concentration abruptly increases substantially corresponds to the third portion P03.

Subsequently, the increase rate of the Mg concentration is lower. This portion corresponds to the fifth portion P05. Then, the increase rate becomes high again to reach the maximum value (not less than $1 \times 10^{20}$ cm$^{-3}$ and not more than $3 \times 10^{20}$ cm$^{-3}$) which is the target value of the second stage. This portion corresponds to the fourth portion P04. The drive voltage can be lower by such a profile of the Mg concentration.

Thus, it is considered that the increase of the Mg concentration including two abrupt increasing regions (the third portion P03 and the fourth portion P04) and a gradual increasing region (the fifth portion P05) between the two abrupt increasing regions is related to the change of the Al concentration. Further, it is considered that this is related to the In concentration decreasing away from the light emitting layer 30.

Figure 6:
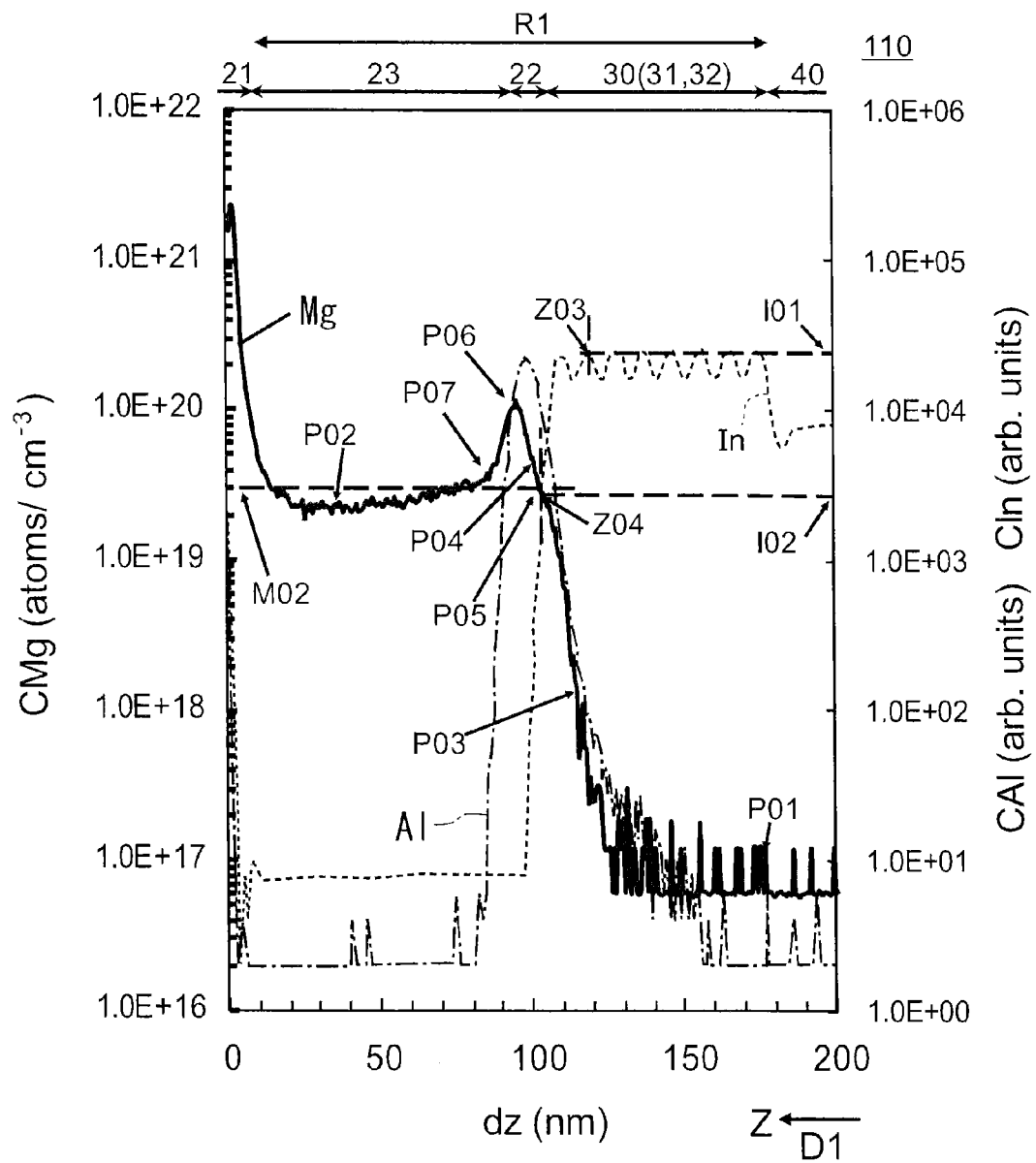
FIG. 6 is another graph showing the semiconductor light emitting device according to the first embodiment.

FIG. 6 is another graph showing the semiconductor light emitting device according to the first embodiment.

Figure 7:
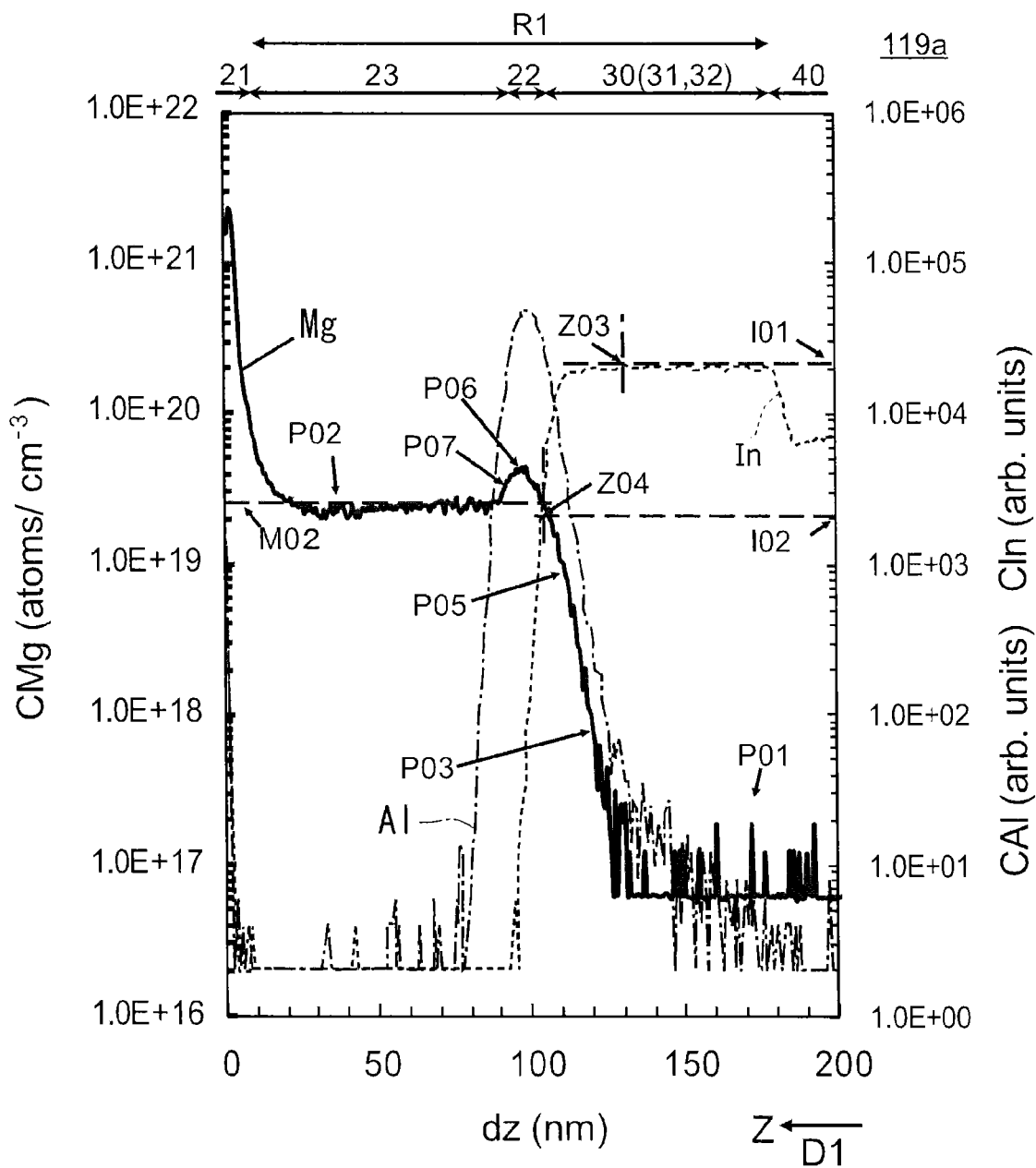
FIG. 7 is other graph showing the semiconductor light emitting device of the reference example.
Figure 8:
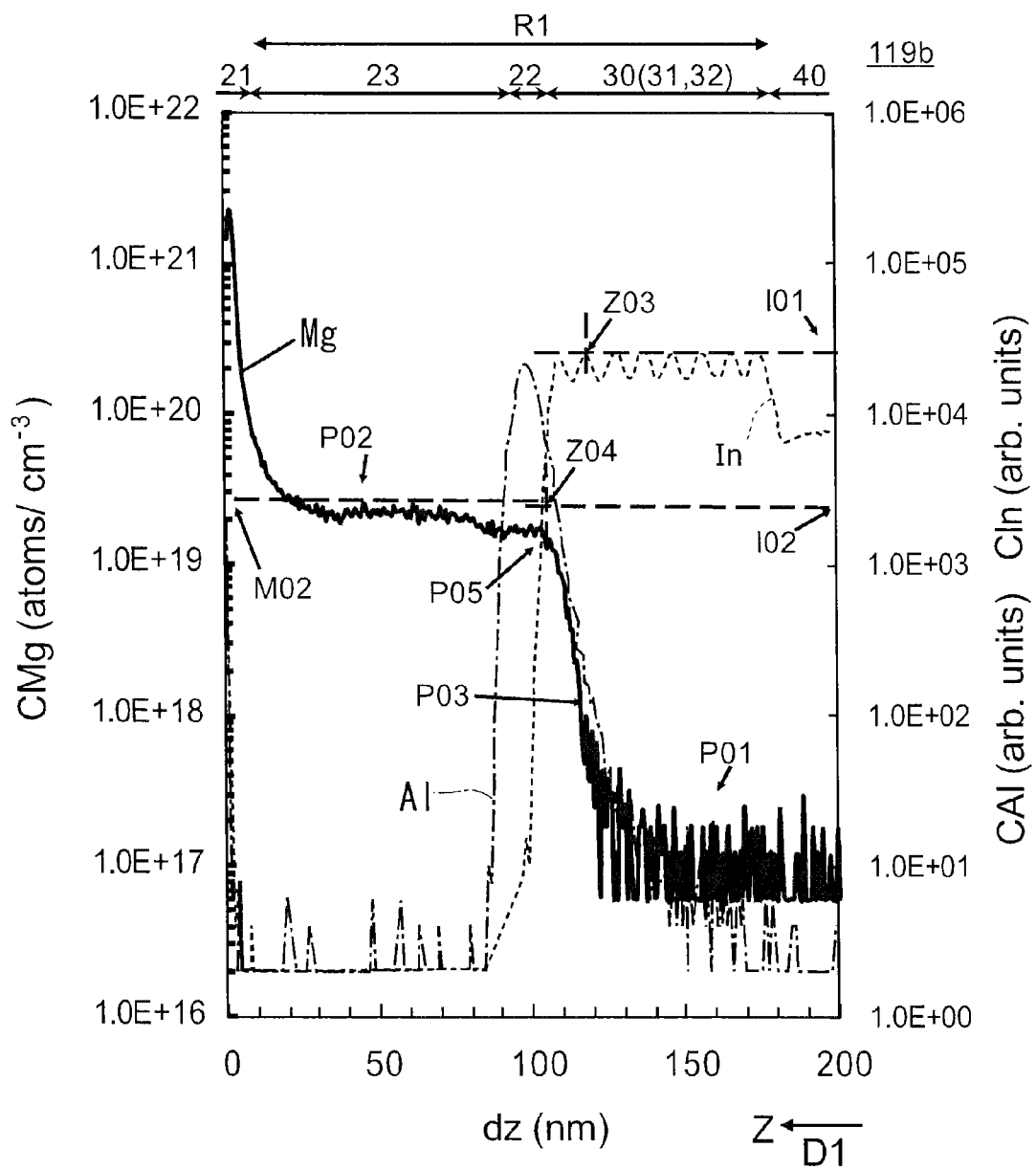
FIG. 8 is other graph showing the semiconductor light emitting device of the reference example.

FIG. 7 and FIG. 8 are other graphs showing the semiconductor light emitting devices of the reference examples.

In FIG. 6, FIG. 7, and FIG. 8, the profile of the In concentration is added to the graphs shown in FIG. 1, FIG. 4, and FIG. 5, respectively. In these drawings, the vertical axis on the right is the In concentration (CIn having arbitrary units).

In the semiconductor light emitting device 110 as shown in FIG. 6, the In concentration corresponding to the multiple well layers 32 is high. The In concentration of, for example, the third p-side layer 23 of the p-type semiconductor layer 20 is low.

A third position Z03 and a fourth position Z04 are set in the p-side region R1 to describe the profile of the In concentration.

The In concentration at the third position Z03 in the p-side region R1 is taken as a first In value I01. The first In value I01 is the maximum value of the In concentration of the light emitting layer 30.

The fourth position Z04 is arranged with the third position Z03 along the first direction D1 in the region between the third position Z03 and the position corresponding to the second portion P02. The third position is a position along the first direction D1. The fourth position also is a position along the first direction D1. The In concentration at the fourth position Z04 is a second In value I02. The second In value I02 is 1/10 of the first In value I01 (the maximum value).

In the semiconductor light emitting device 110 according to the embodiment, the Mg concentration (a second Mg value M02) at the fourth position Z04 is not less than $3 \times 10^{19}$ cm$^{-3}$. It is favorable for the Mg concentration (the second Mg value M02) at the fourth position Z04 to be $8 \times 10^{19}$ cm$^{-3}$ or less. Specifically, in the semiconductor light emitting device 110 as shown in FIG. 6, the second Mg value M02 at the fourth position Z04 is, for example, $3 \times 10^{19}$ cm$^{-3}$.

As shown in FIG. 6, the fourth position Z04 corresponds to the position of the fifth portion P05. In other words, in the p-side region R1, the Mg concentration increases relatively abruptly in the region where the In concentration changes from the maximum value (the first In value I01) to the value (the second In value I02) of 1/10 of the maximum value. This region corresponds to the third portion P03. Then, when the In concentration is the second In value I02, the increase rate of the Mg concentration is lower (the fifth portion P05). Then, the Mg concentration increases abruptly again when the In concentration becomes lower than the second In value I02. This region corresponds to the fourth portion P04.

The Mg concentration can reach the maximum value that is not less than $1 \times 10^{20}$ cm$^{-3}$ and not more than $3 \times 10^{20}$ cm$^{-3}$ by doping Mg at a high concentration from the position where the In concentration becomes less than 1/10 of the maximum value.

In the embodiment, it is considered that the Mg concentration increases abruptly in two stages in conjunction with the decrease of the concentration of In by supplying a large supply amount of $Cp_2Mg$ in the method in which TMG, TMA, and $Cp_2Mg$ are supplied in pulses while supplying a constant amount of $NH_3$.

In the semiconductor light emitting device 119a which is the first reference example as shown in FIG. 7, the second Mg value M02 at the fourth position Z04 is $2.5 \times 10^{19}$ cm$^{-3}$. In the first reference example, the second Mg value M02 is lower than the value of the semiconductor light emitting device 110.

In the semiconductor light emitting device 119b which is the second reference example as shown in FIG. 8, the second Mg value M02 at the fourth position Z04 is $1.8 \times 10^{19}$ cm$^{-3}$. In the second reference example as well, the second Mg value M02 is lower than the value of the semiconductor light emitting device 110.

A low drive voltage can be realized by the Mg concentration (the second Mg value M02) at the fourth position Z04 being not less than $3 \times 10^{19}$ cm$^{-3}$.

As shown in FIG. 6, the Mg concentration of the fifth portion P05 is, for example, not less than $1.0 \times 10^{19}$ cm$^{-3}$ and not more than $3 \times 10^{19}$ cm$^{-3}$. The Mg concentration of the fifth portion P05 can be set to be relatively high. In the embodiment, the Mg concentration increases from the second p-side layer 22 toward the third p-side layer 23. Therefore, smooth carrier injection is achieved. Thereby, the drive voltage can be lower.

There are examples where C (carbon) is doped together with Mg to suppress the formation of an undoped Mg region. In the semiconductor light emitting device 110, the concentration of C (carbon) in the p-side region R1 is, for example, not more than $5 \times 10^{18}$ cm$^{-3}$. That is, in the semiconductor light emitting device 110, C (carbon) substantially is not doped. In the semiconductor light emitting device 110, the formation of a region of the p-type semiconductor layer 20 having a low Mg concentration can be suppressed without doping with C (carbon).

In the semiconductor light emitting device 110, the length (the thickness) of the fifth portion P05 along the first direction D1 is shorter than the length (the thickness) of the third portion P03 along the first direction D1. The length (the thickness) of the fifth portion P05 along the first direction D1 is shorter than the length (the thickness) of the fourth portion P04 along the first direction D1. The lower drive voltage is obtained more effectively by reducing the thickness of the fifth portion P05 which has the low increase rate of the Mg concentration.

The length (the thickness) of the third portion P03 along the first direction D1 is, for example, not less than 5 nm and not more than 30 nm. The length (the thickness) of the fourth portion P04 along the first direction D1 is, for example, not less than 5 nm and not more than 30 nm. The length (the thickness) of the fifth portion P05 along the first direction D1 is, for example, not less than 3 nm and not more than 20 nm.

The distance along the first direction between the first position Z01 (the position where the Al concentration becomes the first Al value A01 which is the maximum value) and the second position Z02 (the position where the Al concentration becomes the second Al value A02 which is 1/100 of the first Al value A01) is, for example, not less than 5 nm and not more than 30 nm. In the case where the distance is too short, it becomes difficult for the increase of the Mg concentration to follow the increase of the Al concentration. In the case where the distance is too long, for example, the crystallinity degrades easily. Also, there are cases where the electron blocking properties degrade and the luminous efficiency decreases.

In the embodiment, for example, the second position Z02 is positioned inside the third portion P03. The second position Z02 may be positioned inside the fifth portion P05. The second position Z02 may be positioned inside the fourth portion P04.

Figure 9:
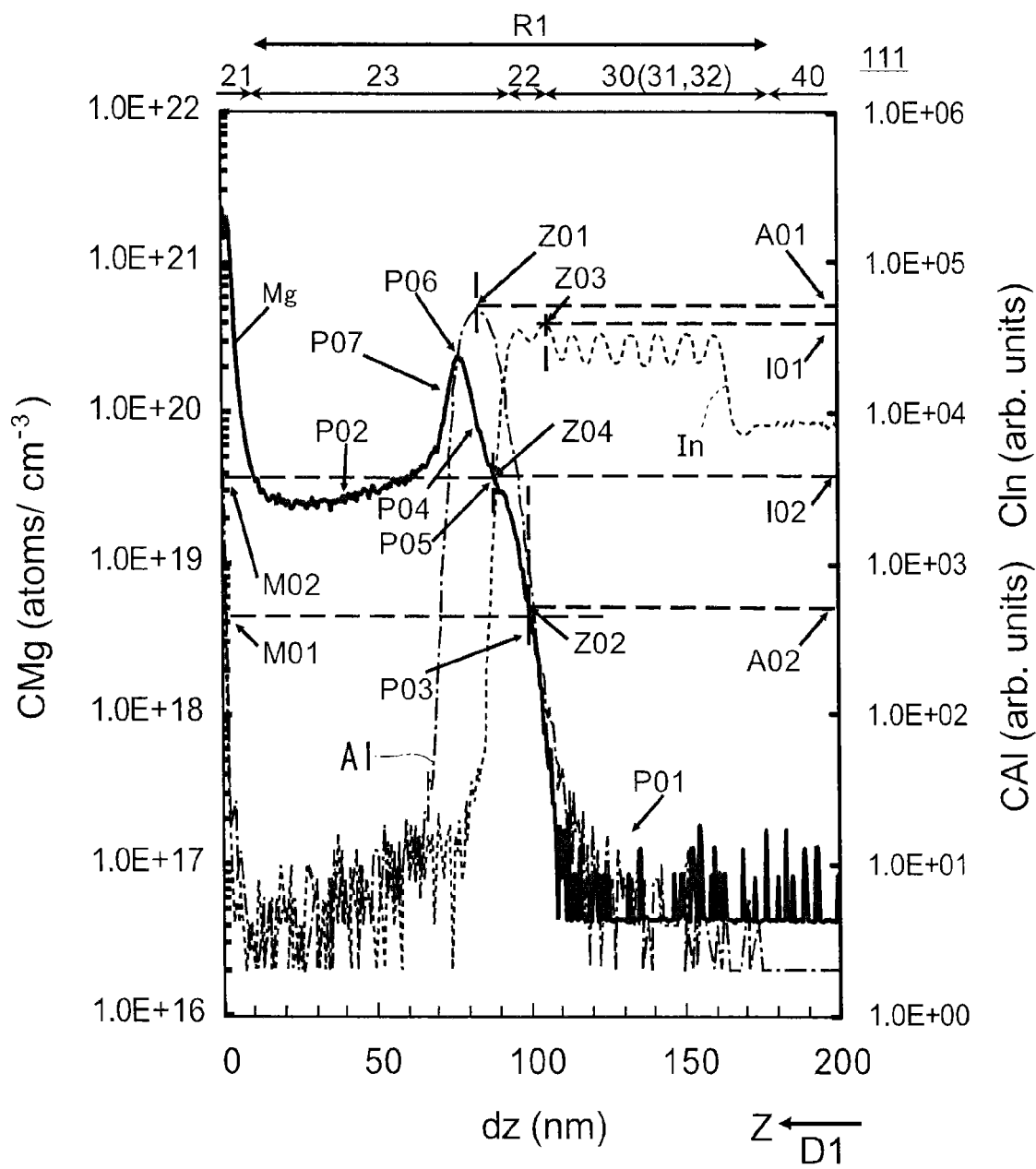
FIG. 9 is a graph showing another semiconductor light emitting device according to the first embodiment.

FIG. 9 is a graph showing another semiconductor light emitting device according to the first embodiment.

FIG. 9 shows the profile (CMg) of the Mg concentration, the profile (CAl) of the Al concentration, and the profile (CIn) of the In concentration of the semiconductor light emitting device 111 according to the embodiment. In the semiconductor light emitting device 111, the thickness of the second p-side layer 22 is 15 nm. The configuration and formation methods of the semiconductor light emitting device 111 are the same as those of the semiconductor light emitting device 110.

As shown in FIG. 9, the first to seventh portions P01 to P07 are provided in the semiconductor light emitting device 111 as well. Also, similarly to the description regarding the semiconductor light emitting device 110, the first to fourth positions Z01 to Z04 are set.

In the semiconductor light emitting device 111 as well, the Mg concentration increases to follow the increase of the Al concentration in the p-side region R1. The Mg concentration (the first Mg value M01) at the second position Z02 is $4.5 \times 10^{18}$ cm$^{-3}$. The Mg concentration of the sixth portion P06 of the second p-side layer 22 is $2.3 \times 10^{20}$ cm$^{-3}$. The Mg concentration (the second Mg value M02) at the fourth position Z04 is $3.9 \times 10^{19}$ cm$^{-3}$.

In the semiconductor light emitting device 111 as well, the drive voltage can be lower.

Figure 10:
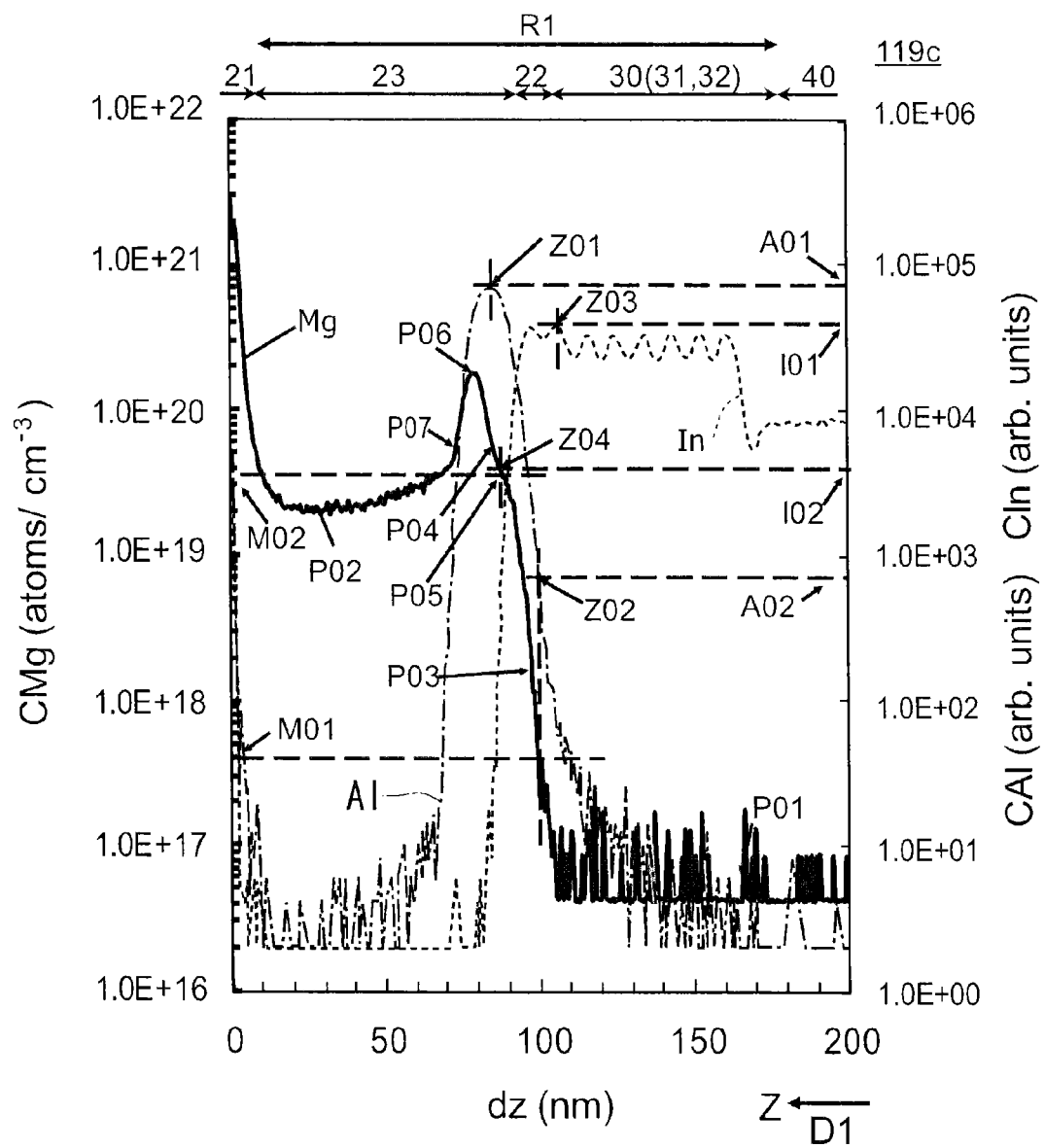
FIG. 10 is a graph showing a semiconductor light emitting device of a reference example.

FIG. 10 is a graph showing a semiconductor light emitting device of a reference example.

FIG. 10 shows the profile (CMg) of the Mg concentration, the profile (CAl) of the Al concentration, and the profile (CIn) of the In concentration of the semiconductor light emitting device 119c of the third reference example. In the semiconductor light emitting device 119c as well, the thickness of the second p-side layer 22 is 15 nm. Other than the thickness of the second p-side layer 22 being 15 nm, the semiconductor light emitting device 119c is formed by a method that is similar to that of the semiconductor light emitting device 119a of the first reference example.

In the semiconductor light emitting device 119c of the third reference example, the increase of the Mg concentration is slower than the increase of the Al concentration. In the semiconductor light emitting device 119c, the Mg concentration (the first Mg value M01) at the second position Z02 is $3.8 \times 10^{17}$ cm$^{-3}$. The maximum value of the Mg concentration of the second p-side layer 22 is $1.8 \times 10^{20}$ cm$^{-3}$. The Mg concentration (the second Mg value M02) at the fourth position Z04 is $2.8 \times 10^{19}$ cm$^{-3}$. The drive voltage of the semiconductor light emitting device 119c is higher than that of the semiconductor light emitting device 111.

For a high current density region, the device characteristics of the semiconductor light emitting device 111 are better than those of the semiconductor light emitting device 119c.

Second Embodiment

The embodiment relates to a method for manufacturing the semiconductor light emitting device. For example, the method for manufacturing the semiconductor light emitting device 110 described above, etc., are applicable as the manufacturing method.

Figure 11:
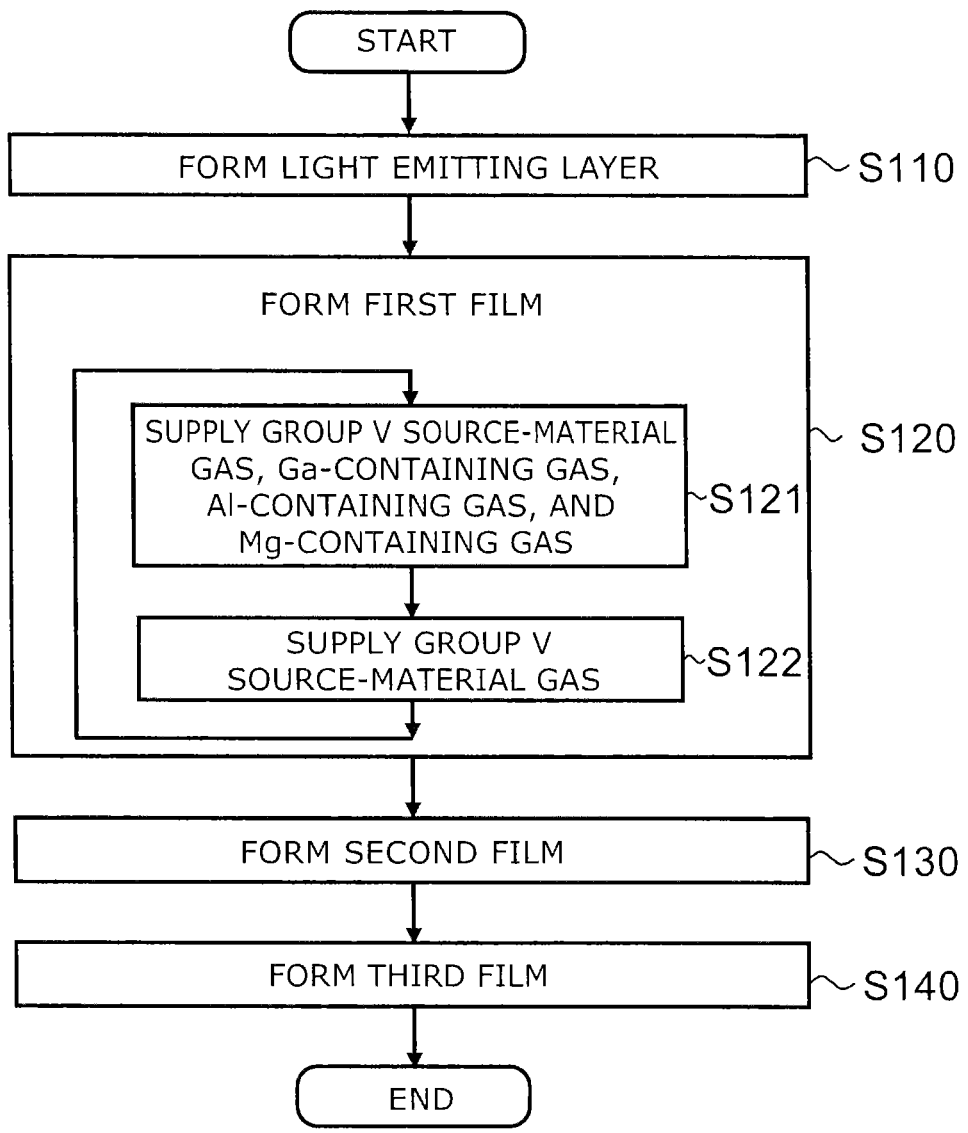
FIG. 11 is a flowchart showing the method for manufacturing the semiconductor light emitting device according to the second embodiment.

FIG. 11 is a flowchart showing the method for manufacturing the semiconductor light emitting device according to the second embodiment.

The method for manufacturing the semiconductor light emitting device according to the embodiment includes a process (step S110) of forming the light emitting layer 30 that includes a nitride semiconductor on the n-type semiconductor layer 10 that includes a nitride semiconductor.

The manufacturing method further includes a process (step S120) of forming a first film (the second p-side layer 22) of $Al_xGa_{1-x}N$ (0.05≤x≤0.2) including Mg on the light emitting layer 30.

The manufacturing method further includes a process (step S130) of forming a second film (the third p-side layer 23) including a nitride semiconductor including Mg on the first film.

The manufacturing method further includes a process (step S140) of forming a third film (the first p-side layer 21) including a nitride semiconductor including Mg on the second film.

In the process (step S120) of forming the first film, the first process (step S121) and the second process (step S122) are multiply repeated alternately. In the first process, a group V source-material gas, a gas including Ga, a gas including Al, and a gas including Mg are supplied. In the second process, a group V source-material gas is supplied without supplying the gas including gallium recited above, the gas including Al recited above, and the gas including Mg recited above.

For example, $NH_3$ is used as the group V source-material gas. For example, at least one selected from TMG and TEG is used as the gas including Ga. For example, TMA is used as the gas including Al. For example, $Cp_2Mg$ is used as the gas including Mg.

In the manufacturing method as shown in FIG. 1, FIG. 6, and FIG. 9, the maximum value of the concentration of the Mg in the p-side region R1 that includes the light emitting layer 30, the first film (the second p-side layer 22), and the second film (the third p-side layer 23) is not less than $1\times10^{20}$ $cm^{-3}$ and not more than $3\times10^{20}$ $cm^{-3}$.

The Al concentration has a maximum value at the first position Z01 in the p-side region R1. The second position Z02 is arranged with the first position Z01 along the first direction D1 from the light emitting layer 30 toward the first film (the second p-side layer 22) in the region between the first position Z01 and the position corresponding to the light emitting layer 30. The Al concentration at the second position Z02 is 1/100 of the maximum value. The Mg concentration at the second position Z02 is not less than $2\times10^{18}$ $cm^{-3}$.

According to the manufacturing method according to the embodiment, a method for manufacturing a semiconductor light emitting device having a low drive voltage can be provided.

In the manufacturing method, the concentration profile of Mg in the p-side region R1 may include the first to seventh portions P01 to P07.

The second portion P02 is provided between the first portion P01 and the third film (the first p-side layer 21). The third portion P03 is provided between the first portion P01 and the second portion P02. The Mg concentration of the third portion P03 increases at the first increase rate along the first direction D1.

The fourth portion P04 is provided between the third portion P03 and the second portion P02. The Mg concentration of the fourth portion P04 increases at the second increase rate along the first direction D1.

The fifth portion P05 is provided between the third portion P03 and the fourth portion P04. The Mg concentration of the fifth portion P05 increases at the third increase rate along the first direction D1. The third increase rate is lower than the first increase rate and lower than the second increase rate.

The sixth portion P06 is provided between the fourth portion P04 and the second portion P02. The Mg concentration of the sixth portion P06 is not less than $1\times10^{20}$ $cm^{-3}$ and not more than $3\times10^{20}$ $cm^{-3}$ and is higher than the concentrations of Mg of the first portion P01, the second portion P02, the third portion P03, the fourth portion P04, and the fifth portion P05.

The seventh portion P07 is provided between the sixth portion P06 and the second portion P02. The Mg concentration of the seventh portion P07 decreases along the first direction D1.

In the manufacturing method, the concentration of C (carbon) in the p-side region R1 is not more than $5\times10^{18}$ $cm^{-3}$.

According to the embodiments, a semiconductor light emitting device having a low drive voltage and a method for manufacturing the semiconductor light emitting device can be provided.

In the specification, "nitride semiconductor" includes all compositions of semiconductors of the chemical formula $B_xIn_yAl_zGa_{1-x-y-z}N$ (0≤x≤1, 0≤y≤1, 0≤z≤1, and x+y+z≤1) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In this specification, "perpendicular" and "parallel" are not always exactly perpendicular and parallel and include, for example, variation in the manufacturing process.

In the above, embodiments of the invention have been described with reference to specific examples, however the invention is not limited to these specific examples. For example, specific configurations of various components used in light emitting device such as the substrate, the buffer layer, the foundation layer, the semiconductor layer, the intermediate layer, the light emitting layer and the electrode or the like that are suitably selected from the publicly known ones by those skilled in the art are encompassed within the scope of the invention as long as the configurations can implement the invention similarly and achieve the same effects.

Components in two or more of the specific examples can be combined with each other as long as technically feasible, and such combinations are also encompassed within the scope of the invention as long as they fall within the spirit of the invention.

The light emitting device and a method for manufacturing the same described above as the embodiments of the invention can be suitably modified and practiced by those skilled in the art, and such modifications are also encompassed within the scope of the invention as long as they fall within the spirit of the invention.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, comprising:
   forming a light emitting layer including a nitride semiconductor on an n-type semiconductor layer including a nitride semiconductor;
   forming a first film of $Al_xGa_{1-x}N$ (0.05≤x≤0.2) on the light emitting layer, the first film including Mg;

forming a second film including a nitride semiconductor including Mg on the first film; and forming a third film including a nitride semiconductor including Mg on the second film, the forming of the first film including alternately and multiply repeating:

a first process of supplying a group V source-material gas, a gas including Ga, a gas including Al, and a gas including Mg; and a second process of supplying the group V source-material gas without supplying the gas including Ga, the gas including Al, and the gas including Mg, a maximum value of a concentration of Mg in a p-side region including the light emitting layer, the first film, and the second film being not less than $1 \times 10^{20}$ cm$^{-3}$ and not more than $3 \times 10^{20}$ cm$^{-3}$, an Al concentration in the p-side region having a maximum value at a first position, the Al concentration being $1/100$ of the maximum value at a second position arranged with the first position along a first direction from the light emitting layer toward the first film in a region between the first position and a position corresponding to the light emitting layer, a Mg concentration at the second position being not less than $2 \times 10^{18}$ cm$^{-3}$.

2. The method according to claim 1, wherein a concentration profile of Mg in the p-side region includes:

a first portion;

a second portion provided between the first portion and the third film;

a third portion provided between the first portion and the second portion, a Mg concentration of the third portion increasing at a first increase rate along the first direction;

a fourth portion provided between the third portion and the second portion, a Mg concentration of the fourth portion increasing at a second increase rate along the first direction;

a fifth portion provided between the third portion and the fourth portion, a Mg concentration of the fifth portion increasing at a third increase rate along the first direction, the third increase rate being lower than the first increase rate and lower than the second increase rate;

a sixth portion provided between the fourth portion and the second portion, a Mg concentration of the sixth portion being not less than $1 \times 10^{20}$ cm$^{-3}$ and not more than $3 \times 10^{20}$ cm$^{-3}$ and being higher than the concentrations of Mg of the first portion, the second portion, the third portion, the fourth portion, and the fifth portion; and a seventh portion provided between the sixth portion and the second portion, a Mg concentration of the seventh portion decreasing along the first direction.

3. The method according to claim 1, wherein a concentration of C (carbon) in the p-side region is not more than $5 \times 10^{18}$ cm$^{-3}$.

4. The method according to claim 2, wherein the Mg concentration at the second position is not more than $1.2 \times 10^{19}$ cm$^{-3}$.

5. The method according to claim 2, wherein the Mg concentration of the fifth portion is not less than $1 \times 10^{19}$ cm$^{-3}$ and not more than $3 \times 10^{19}$ cm$^{-3}$.

6. The method according to claim 2, wherein a concentration of C (carbon) in the p-side region is not more than $5 \times 10^{18}$ cm$^{-3}$.

7. The method according to claim 2, wherein a length of the fifth portion along the first direction is shorter than a length of the third portion along the first direction and shorter than a length of the fourth portion along the first direction.

8. The method according to claim 2, wherein a length of the third portion along the first direction is not less than 5 nm and not more than 30 nm.

9. The method according to claim 2, wherein a length of the fourth portion along the first direction is not less than 5 nm and not more than 30 nm.

10. The method according to claim 2, wherein a length of the fifth portion along the first direction is not less than 3 nm and not more than 20 nm.

11. The method according to claim 2, wherein a distance along the first direction between the first position and the second position is not less than 5 nm and not more than 30 nm.

12. The method according to claim 2, wherein the Mg concentration at the fourth position is not more than $8 \times 10^{19}$ cm$^{-3}$.

13. The method according to claim 2, wherein the second position is positioned inside the third portion.

14. The method according to claim 2, wherein the second position is positioned inside the fifth portion.

15. The method according to claim 2, wherein the second position is positioned inside the fourth portion.

16. The method according to claim 2, wherein the group V source-material gas includes $NH_3$, the gas including Ga includes at least one of tri-methyl gallium and tri-ethyl gallium, the gas including Al includes tri-methyl aluminum, and the gas including Mg includes bis(cyclopentadienyl) magnesium.

* * * * *